(12) United States Patent
Carlson et al.

(10) Patent No.: US 6,837,431 B2
(45) Date of Patent: Jan. 4, 2005

(54) SEMICONDUCTOR DEVICE ADAPTED FOR IMAGING BAR CODE SYMBOLS

(75) Inventors: Bradley S. Carlson, Northport, NY (US); Mehul Patel, Fort Salonga, NY (US); Thomas D. Bianculli, Manorville, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 10/219,690

(22) Filed: Aug. 15, 2002

(65) Prior Publication Data

US 2003/0189099 A1 Oct. 9, 2003

Related U.S. Application Data

(63) Continuation-in-part of application No. 10/118,562, filed on Apr. 9, 2002.

(51) Int. Cl.$^7$ .................................................. G06K 7/10
(52) U.S. Cl. ................................................. 235/454
(58) Field of Search ............................. 235/454, 461, 235/462.01, 462.11, 462.41, 492, 462.24, 462.31, 462.32, 462.45, 472.01, 462.28, 455, 439

(56) References Cited

U.S. PATENT DOCUMENTS

| | | | | |
|---|---|---|---|---|
| 4,845,552 A | * | 7/1989 | Jaggi et al. ................. 382/128 |
| 5,309,241 A | * | 5/1994 | Hoagland ................. 348/222.1 |
| 5,668,597 A | * | 9/1997 | Parulski et al. ............. 348/350 |
| 5,698,833 A | * | 12/1997 | Skinger ................. 235/462.09 |
| 5,770,847 A | * | 6/1998 | Olmstead ................ 235/462.35 |
| 5,814,803 A | * | 9/1998 | Olmstead et al. ....... 235/462.01 |
| 5,828,406 A | * | 10/1998 | Parulski et al. ........... 348/220.1 |
| 5,837,985 A | * | 11/1998 | Karpen ................... 235/462.27 |
| 5,874,994 A | * | 2/1999 | Xie et al. .................... 348/349 |
| 5,920,056 A | * | 7/1999 | Bonnet ....................... 235/383 |
| 6,073,851 A | * | 6/2000 | Olmstead et al. ....... 235/462.45 |
| 6,107,920 A | * | 8/2000 | Eberhardt et al. ........ 340/572.7 |
| 6,123,261 A | * | 9/2000 | Roustaei ................ 235/462.01 |
| 6,138,915 A | | 10/2000 | Danielson et al. |
| 6,176,429 B1 | * | 1/2001 | Reddersen et al. .... 235/462.25 |
| 6,198,577 B1 | * | 3/2001 | Kedar et al. ................ 359/663 |
| 6,371,374 B1 | * | 4/2002 | Schwartz et al. ...... 235/462.42 |
| 6,380,539 B1 | * | 4/2002 | Edgar ..................... 250/339.05 |
| 6,505,778 B1 | * | 1/2003 | Reddersen et al. .... 235/462.25 |
| 6,607,128 B1 | * | 8/2003 | Schwartz et al. ........... 235/454 |
| 6,629,641 B2 | * | 10/2003 | Tsikos et al. .......... 235/462.01 |
| 6,634,558 B1 | * | 10/2003 | Patel et al. ............. 235/472.01 |
| 6,685,092 B2 | * | 2/2004 | Patel et al. .................. 235/454 |
| 2003/0029915 A1 | * | 2/2003 | Barkan et al. .............. 235/454 |
| 2003/0080188 A1 | * | 5/2003 | Carlson et al. ............. 235/454 |
| 2003/0080189 A1 | * | 5/2003 | Patel et al. ................. 235/454 |
| 2003/0086133 A1 | * | 5/2003 | Schinner ..................... 358/538 |

FOREIGN PATENT DOCUMENTS

WO  WO 9964980 A1 * 12/1999 ............ G06K/7/10

* cited by examiner

Primary Examiner—Thien M. Le
Assistant Examiner—Uyen-Chau N. Le
(74) Attorney, Agent, or Firm—Kirschstein, et al.

(57) ABSTRACT

A semiconductor device for imaging optical code symbols comprises no more than 1024 pixels, wherein each of the pixels has an aspect ratio that is greater than 2 to 1 with a short dimension not greater than 4 μm and not less than 2 μm, wherein preferably the pixels are arranged in a single row. The semiconductor may have a collection surface configured as a set of no less than 256 and no more than 1024 pixels. Also provided is a bar code reader including a sensor for imaging a field of view of the reader comprising a single semiconductor device as described above.

2 Claims, 8 Drawing Sheets

SEMICONDUCTOR DEVICE ADAPTED FOR IMAGING BAR CODE SYMBOLS

REFERENCES TO RELATED APPLICATIONS

This application is a continuation-in-part application which claims the benefit of priority to U.S. patent application Ser. No. 10/118,562, filed Apr. 9, 2002. This application is also related to U.S. patent application Ser. No. 09/880,906, filed Jun. 1, 2001. This application is also related to U.S. patent application Ser. No. 10/191,970, filed Jul. 8, 2002, entitled Bar Code Reader Including Linear Sensor Array And Hybrid Camera And Bar Code Reader" of Patel, et al.

BACKGROUND OF THE INVENTION

FIELD OF INVENTION

The present invention relates to semiconductor devices adapted for imaging optical code symbols, in particular bar code symbols, and to bar code readers including such a semiconductor device.

Optical codes are patterns made up of image areas having different light reflective or light emissive properties, which are typically assembled in accordance with a priori rules. The term "bar code" is sometimes used to describe certain kinds of optical codes. The optical properties and patterns of optical codes are selected to distinguish them in appearance from the background environments in which they are used. Devices for identifying or extracting data from optical codes are sometimes referred to as "optical code readers" of which bar code scanners are one type. Optical code readers are used in both fixed and portable installations in many diverse environments such as in stores for checkout services, in manufacturing locations for work flow and inventory control and in transport vehicles for tracking package handling. The optical code can be used as a rapid, generalized means of data entry, for example, by reading a target bar code from a printed listing of many bar codes. In some uses, the optical code reader is connected to a portable data processing device or a data collection and transmission device. Frequently, the optical code reader includes a handheld sensor which is manually directed at a target code.

Most conventional code readers are designed to read one-dimensional bar code symbols. The bar code is a pattern of variable-width rectangular bars separated by fixed or variable width spaces. The bars and spaces have different light reflecting characteristics. One example of a one-dimensional bar code is the UPC/EAN code used to identify, for example, product inventory.

Bar codes can be read employing solid state imaging devices. For example, an image sensor may be employed which has a two-dimensional array of cells or photo sensors which correspond to image elements or pixels in a field of view of the device. Such an image sensor may be a two-dimensional or area charge coupled device (CCD) and associated circuits for producing electronic signals corresponding to a two-dimensional array of pixel information for a field of view. A one-dimensional linear array of photo-diodes is also known for use in detecting a bar code reflection image, for example, U.S. Pat. No. 6,138,915 to Danielson, et al., which is herein expressly incorporated by reference.

It is known in the art to use a CCD image sensor and objective lens assembly in an optical code reader. In the past, such systems have employed complex objective lens assemblies originally designed for relatively expensive video imaging systems. Such systems may have a single sharp focus and a limited depth of field, which along with conventional aiming, illumination and signal processing and decoding algorithms, limits the versatility and working range of the system.

Other known imaging systems are designed primarily for reading optical codes. Such reading systems involve the assembly and alignment of several small parts. These parts may include a lens, an aperture and a 2D image sensor array such as a CCD chip. Such a structure is illustrated, for example, in WO 99/64980 which is hereby incorporated by reference herein. A miniature imager adapted for use in a hand mounted code reader is disclosed in U.S. patent application Ser. No. 09/684,514 filed Oct. 10, 2000 to Patel, et al., which is herein expressly incorporated by reference.

The design of an imaging system is dependent upon the size of the package in which the imaging system is to be manufactured. Conventional imaging systems which utilize off-the-shelf components are difficult to miniaturize due to the limited selection of off-the-shelf components. Further, due to various optical phenomena in the design of a miniature imager, various tradeoffs between a component size and the quality of a scanned image must be weighed in the selection of components. Additionally, the selection of certain components for an imager may, due to optical phenomena, limit the choice of other components for the miniature imager.

SUMMARY OF THE INVENTION

OBJECTS OF THE INVENTION

Accordingly, it is an object of the present invention to provide a semiconductor device for imaging optical code symbols, and a bar code reader including such semiconductor device.

It is a further object of the present invention to provide a semiconductor device which provides an adequate scanned image while minimizing the physical size and shape, i.e., the form factor, of the device.

A semiconductor device for imaging optical code symbols is typically used in portable applications where the semiconductor device is incorporated into a handheld device. These handheld devices typically have a limited battery capacity.

It is an object of the present invention to provide a semiconductor device adapted for imaging bar code symbols which uses a minimum amount of power in the capture and processing of an image.

Conventional imaging systems which employ solid state imagers suffer from a limitation on the distance that a target image can be from the lens of the imager for correct decoding of the target imager. Specifically, in conventional imaging systems the plane of the pixel array of the solid state imager is arranged perpendicular to the optical axis of the focusing lens. Accordingly, the pixels of the solid state imager are all focused on the same spatial plane of the target image.

All of the pixels being focused on the same spatial plane severely limits the working range, i.e., the distance between the imaging system and the target image, of the imaging system. If a conventional imaging system has a single fixed focus lens, adjustments between the imaging system and the target image may have to be made in order to properly receive and decode the target image.

To provide illumination and to assist in aiming, imaging systems can employ either lasers or light emitting diodes (LEDs). LEDs may be preferred over lasers since the incoherent nature of the LED light source does not produce the speckle noise impact that is produced by lasers. Further, LEDs are more cost effective than lasers due to the ease of manufacturing and packing of LEDs. Additionally, LEDs can be built more compactly and are easier to surface mount than lasers. However, compared to lasers, LEDs are not an ideal point source. Specifically, light produced by an LED is less focused which produces an increased line thickness of the projected light. To reduce the line thickness of the light produced by an LED, many designers place a mechanical slit in front of the LED. However, the mechanical slit reduces the amount of light that is projected by the LED onto an object.

The objects and features of the invention will be apparent from this written description and drawings.

FEATURES OF THE INVENTION

These and other problems, drawbacks and limitations of conventional techniques are overcome according to the present invention by a semiconductor device for imaging optical code symbols, in particular bar code symbols, as set forth herein, and by a bar code reader as set forth herein. Preferred embodiments of the present invention are set forth herein.

In a miniature imager which may be used in connection with the present invention, the pixel width or pitch of an imaging array is reduced compared to a larger sized imager while maintaining the instantaneous field of view of each pixel and the area of the aperture compared to larger sized imagers. In accordance with this embodiment an imager with a 4 $\mu$m pixel width or pitch can be produced with a detector array length less than or equal to 2 mm. In accordance with one aspect of this embodiment, by staggering alternate rows of pixels by one half pixel relative to each other a one-dimensional imager can be produced with a pixel width or pitch of approximately 3 $\mu$m and a detector array length of approximately 0.75 mm.

In another embodiment, an imager is provided which has a very small form factor and can be operated with little or no artificial illumination provided by the imager thereby providing very low power operation. In accordance with this embodiment, an imager chip is mounted on an imager board inside of an imager housing. The imager housing forms a dark room around the imager chip thereby enabling the imager to operate without an external seal. In accordance with one aspect of this embodiment, the size of the aperture can be increased to thereby minimize and/or eliminate the need for the imaging engine to provide artificial illumination. In accordance with another aspect of this embodiment, a low noise imager with a gain is provided to reduce and/or eliminate the need for the imaging engine to provide artificial illumination. In accordance with yet another aspect of this embodiment, an imager which provides a nonlinear response, such as a logarithmic imager, can be provided to reduce and/or eliminate the need for the imaging engine to provide artificial illumination.

In accordance with yet another embodiment, an imager includes an image sensor and a focusing lens. The imager sensor has an array of pixels in a first plane and the focusing lens has an optical axis in a second plane. The first and second planes are arranged such that they are not perpendicular to each other, thereby increasing the working range of the imager.

In accordance with another embodiment, a device includes a light emitting diode having a square portion and a rectangular portion, wherein a height and a width of the rectangular portion is not equal to a height of the square portion. The device also includes a bonding pad, wherein the bonding pad is located on the square portion. In accordance with one aspect of this embodiment, the light emitting diode also includes a second square portion, wherein the rectangular portion has a first and a second side the size of the height, wherein the square portion is located on the first side of the rectangular portion and the second square portion is located on the second side of the rectangular portion. A second bonding pad is located on the second square portion. In accordance with another embodiment, a light emitting diode die includes a rectangular shaped light emitting diode with a bonding pad surrounding the light emitting diode.

The above described subject matter may further be defined as follows:

An imager comprises a solid state image sensor for producing electronic signals corresponding to a target image, wherein the image sensor includes an array with a number of pixels less than or equal to 1024 pixels and each pixel has a width or pitch of less than or equal to 4 $\mu$m; and an aperture for receiving light reflected from the target and for passing the reflected light onto the image sensor, wherein preferably the image sensor is a one-dimensional image sensor, the number of pixels is less than or equal to 1024 pixels and each pixel has a width equal to 3 $\mu$m, whereby the length of the array is less than or equal to 1.5 millimeters, or wherein the number of pixels in the image sensor is less than or equal to about 500 pixels, each pixel has a width equal to 3 $\mu$m and wherein the pixels are arranged in two adjacent rows, one row offset by half of a pixel from the other, whereby the length of the array is less than or equal to 0.75 millimeters. Preferably, the above image sensor is a two-dimensional image sensor, whereby the array is less than 2 millimeters in its longest length. In particular, the above image sensor may be a CMOS detector array. The above image sensor is preferably adapted to be mounted on a printed circuit board using re-flow soldering techniques. The above imager may further comprise illumination/aiming light emitting diodes; illumination/aiming lenses; and an imaging lens, wherein the imaging lens is placed in the aperture, wherein the apparatus is included in a molded package. Preferably, the imager has dimensions less than or equal to 5 millimeters by 3 millimeters by 2.25 millimeters.

In another aspect, there is provided an imager comprising an imager housing which includes an imager chip; a lens, wherein the lens is incorporated into the imager housing opposite of the imager chip, and wherein the imaging housing has a volume less than or equal to 3.3 cm$^3$ (0.20 cubic inches). Preferably, the imager chip is enclosed in a dark room, thereby enabling the imager to operate without an external seal. Advantageously, the maximum dimensions of the imager are 20.6×14.2×11.4 mm$^3$. In a preferred embodiment, the imaging housing further includes a light emitting device for illuminating a target image, and/or the imaging housing includes an aperture, wherein the size of the aperture is selected to enable scanning of a target image without illumination by the imager. Preferably, the above imager chip is a low noise imager with a gain, thereby enabling scanning of a target image without illumination by the imager. The above imager chip may be a logarithmic response imager, thereby enhancing a contrast between dark portions and bright portions of a target image and thereby enabling scanning of a target image without illumination by the imager.

According to another aspect, there is provided an imager comprising an imager housing which includes an imager chip; and a lens, wherein the lens is incorporated into the imager housing opposite of the imager chip, and wherein the imager chip is a low noise imager which amplifies the imaged signals, thereby enabling scanning of a target image without illumination by the imager. Preferably, the imager housing has a volume less than or equal to 3.3 cm³ (0.20 cubic inches).

Still further, there is provided an imager comprising an imager housing which includes an imager chip; and a lens, wherein the lens is incorporated into the imager housing opposite the imager chip, and wherein the imager chip provides a nonlinear intensity response to light reflection to the chip by a target image, thereby enabling scanning of the target image without illumination by the imager, wherein preferably the nonlinear representation is a logarithmic representation of the target image. Here also, the imager housing preferably has a volume less than or equal to 3.3 cm³ (0.20 cubic inches).

According to still another aspect, there is provided an imager comprising an imaging sensor mounted on a printed circuit board; and an aperture, wherein the imager has a volume less than or equal to 3.3 cm³. Preferably, the dimensions of the imager are equal to or less than 20.6 by 14.2 by 11.4 millimeters. The imager may further comprise light emitting diodes to provide illumination of a target image, and/or light emitting diodes to illuminate a target on the target image to aid in aiming the imager.

Further, there is provided an imager comprising a two-dimensional image sensor including a portion with horizontal rows of image elements in a first plane; and focusing optics having an optical axis, wherein the image sensor is oriented so that the first plane is not perpendicular to the optical axis and so that different focal distances are provided for different rows of image elements. Preferably, the focusing optics include an objective lens symmetrically containing a plane substantially non-parallel to the first plane. The imager may further comprise light emitting diodes to provide illumination of a target image.

According to another aspect, there is provided a device comprising a light emitting diode having a square portion and a rectangular portion, wherein a height and a width of the rectangular portion is not equal to a height of the square portion; and a bonding pad, wherein the bonding pad is located on the square portion. In a specific embodiment, the rectangular portion preferably has a first and a second side the size of the height, wherein the light emitting diode further comprises a second square portion, wherein the square portion is located on the first side of the rectangular portion and the second square portion is located on the second side of the rectangular portion, and wherein a second bonding pad is located on the second square portion.

Also, there is provided a device comprising a rectangular light emitting diode; and a bonding pad, wherein the bonding pad surrounds the light emitting diode, thereby providing a uniform light power emitted from the light emitting diode.

According to the present invention, there is provided a semiconductor device for imaging optical code symbols, comprising no more than 1024 pixels, wherein each of the pixels has an aspect ratio that is greater than 2 to 1 with a short dimension not greater than 4 µm, and not less than 2 µm, wherein preferably the pixels are arranged in a single row. Moreover, the semiconductor device may have a collection surface configured as a set of not less than 256 and no more than 1024 pixels.

According to another aspect of the present invention, there is provided a bar code reader including a sensor for imaging a field of view of the reader comprising a single semiconductor device as set forth above.

Also described herein is a miniature imager for reading target images. The optical and electrical systems of the miniature imager are optimized to reduce one or more dimensions or the volume of the imager. In accordance with one embodiment, the pixel width or pitch and focal length are decreased from that of a larger imager to maintain a comparable field of view for each pixel. The decreased pixel width or pitch allows the area of the aperture and the instantaneous field of view of the pixel to remain constant while decreasing the overall size of the imager. In other embodiments, apparatus and techniques are provided which reduce and/or eliminate the need for illumination of a target by the imager thereby reducing the overall power consumed by the imager and/or its overall size. An imager with an increased working range is provided, as is a light emitting diode which produces a light with reduced line thickness.

BRIEF DESCRIPTION OF THE DRAWINGS

The objects and advantages of the invention will be understood by reading the following detailed description in conjunction with the drawings in which.

DETAILED DESCRIPTION

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention.

Figure 1A:
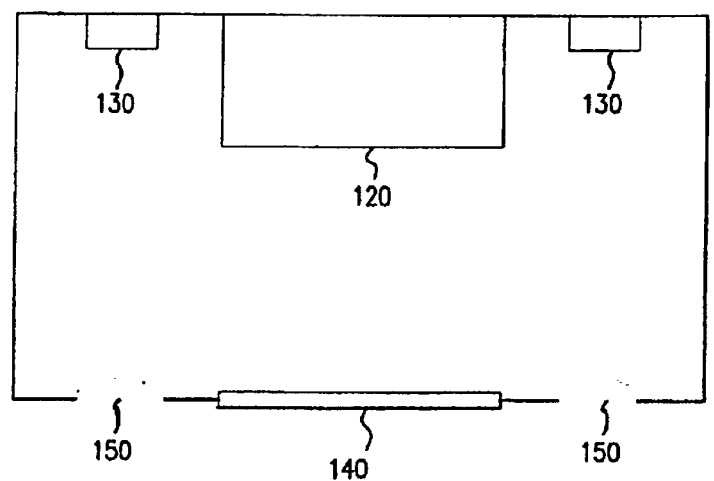
FIGS. 1A and 1B respectively illustrate a top view and a side view of a miniature imager.
Figure 1B:
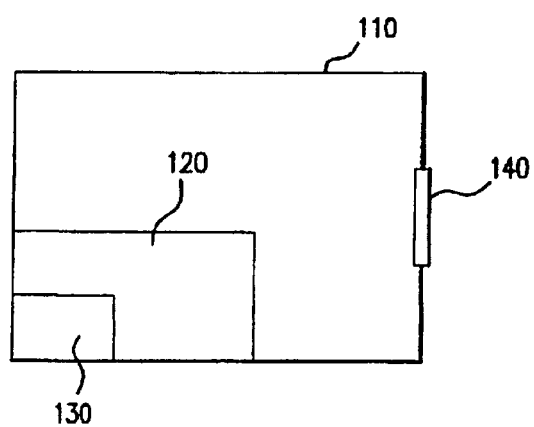

FIGS. 1A and 1B respectively illustrate a top view and a side view of a miniature imager. The imager is incorporated into a molded optical package 110. Structures and techniques for so doing are disclosed in U.S. patent application Ser. No. 09/880,906, filed Jun. 15, 2001 to Mazz et al. entitled "Molded Imager Optical Package and Linear Detector-Based Scan Engines", hereby expressly incorporated by reference. The molded optical package includes an imaging/decoder integrated circuit (IC) 120, illumination/aiming light emitting diodes (LEDs) 130, imaging lens 140 and illumination/aiming lenses 150. In accordance with the preferred embodiment of the present invention, the imaging/decoder IC 120 is fabricated in accordance with known complementary metal oxide semiconductor (CMOS) techniques. Alternatively, the imaging/decoder IC 120 can comprise a CCD imager with associated decoding circuitry.

In operation, the imaging/decoder IC 120 receives an image via imaging lens 140. To assist in the decoding of the target image, illumination LEDs 130 project light on the target image via illumination/aiming lenses 150. The location of the target image in the proper field of view of the imaging/decoder IC is aided by projecting an aiming pattern on the target image using illumination/aiming LEDs 130. Illumination/aiming LEDs are focused on a target image through illumination/aiming lenses 150. It will be recognized that the illumination/aiming lenses 150 can be designed such that the light from illumination/aiming LEDs are scattered in any known target pattern on the target image.

The volume of the imaging system is scaled by scaling the pixel width or pitch of the detector array of imaging/decoder IC 120. It will be recognized that the pixel width or pitch refers to the spacing between image elements, i.e., pixels, on an image sensor. When the pixel width or pitch is decreased the focal length is decreased to maintain a comparable field of view. If the aperture size is kept constant, then the same amount of light is collected per pixel and there is not a loss in imager sensitivity. If the size of the aperture is not limiting the size of the imager, then in a 2D imaging system all three dimensions scale by the scale factor of the pixel. In a 1D imaging system two dimensions scale by the scale factor of the pixel.

The imaging engine is designed to provide a similar depth of focus and similar light throughput for each pixel. This results in a sacrifice of the pixel dynamic range and pixel quantum efficiency. The effect on pixel dynamic range is first order, but dynamic range is not very important for applications such as bar code imaging. The effect on pixel quantum efficiency is second order for relatively large pixels, for example, greater than 5.

It will be recognized that the light collected by an optical system from a point source is given by the equation:

$$\frac{A_{aperture}}{\pi s^2}$$

In this equation, $A_{aperture}$ is the area of the aperture and s is the distance to the source. By integrating over the instantaneous field of view of a single pixel the amount of light collected by the pixel is given by the equation:

$$\frac{A_{aperture}}{\pi s^2} A_{pixelFOV}$$

When the pixel pitch or width of an imaging system is reduced, the area of the aperture ($A_{aperture}$) and the instantaneous field of view of the pixel ($A_{pixelFOV}$) can be kept constant while maintaining the depth of focus. This ensures that in the object space everything, i.e., aperture size, nominal focal distance, field of view and instantaneous field of view of each pixel, is the same when the sensor size is reduced. Thus, the size of the imaging engine can be scaled with practically no impact on bar code reading performance.

In view of the discussion above, the miniature imager illustrated in FIGS. 1A and 1B has a CMOS detector array with a 4 μm pitch and 512 pixels. This results in an advantageously small detector length of approximately 2 mm. The focal length of the system is approximately 3 mm. Accordingly, the overall dimensions of the scan engine illustrated in FIGS. 1A and 1B can be on the order of 5×3×2.25 mm³.

The practical limit for pixel width or pitch is approximately 3 μm. In 1D systems the detector footprint can be further minimized by making two or more rows of pixels offset, e.g., staggered, from one another. For example, an array of 500 pixels with 3 μm pitch has a length of 1.5 mm. By laying out the array as two adjacent rows offset by half of a pixel, the pixel width or pitch is maintained at 3 μm, but the detector array has a resultant length of 0.75 mm. Since the arrays are offset by half of a pixel, the pixel values can be combined to obtain a resolution equivalent to a 1.5 μm pixel. The pixel width or pitch is maintained at a reasonable level for absorbing photons, but the detector footprint, and thus, the total volume of the system can be dramatically decreased.

The imaging detector array, read-out electronics, analog-to-digital converter and decoding logic may all be integrated into a single chip. The imaging/decoding chip is mounted on a carrier with two LED die or a small laser. The carrier can be an FR4 substrate, an industry recognized organic substrate, and contain a lead frame or solder bumps for attachment to a larger circuit board. The carrier is covered with a molded plastic piece that has the optical surfaces molded into it. The molded plastic cover is optical quality and can tolerate temperatures encountered in automated circuit board assembly. The device is a complete scanner, including opto-mechanics and electronics and can be handled like a surface mount integrated circuit and is compatible with re-flow soldering techniques. The device as illustrated in FIGS. 1A and 1B is a complete imager that can be mechanically attached to a circuit board by solder joints only. Accordingly, the miniature imager illustrated in FIGS. 1A and 1B does not require screws or any similar mechanical support, thus reducing the size and complexity of a device which incorporates this imaging engine.

Figure 2A:
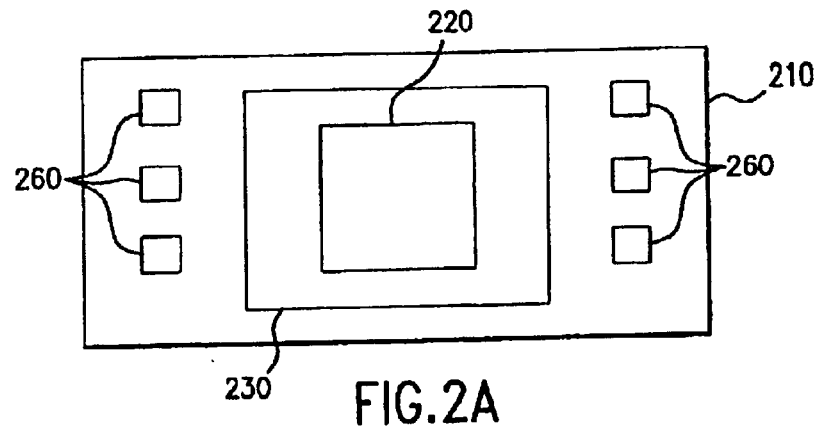
FIGS. 2A–2C respectively illustrate a top, front and side view of another miniature imager.
Figure 2B:
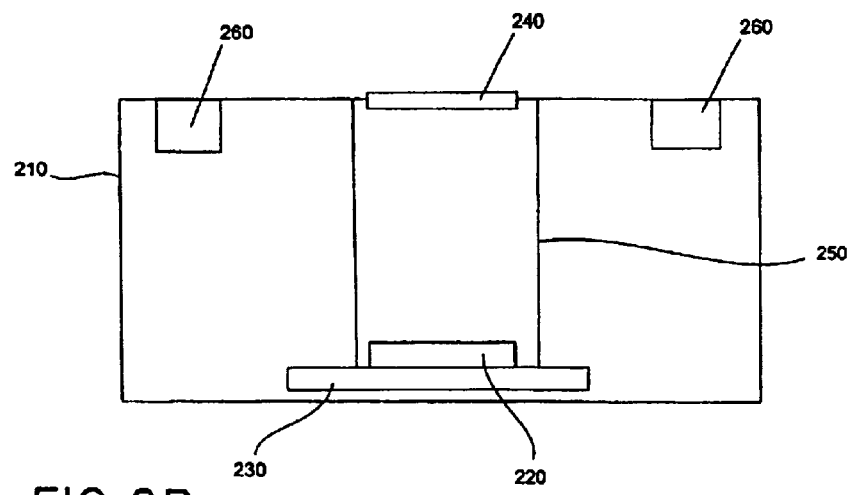
Figure 2C:
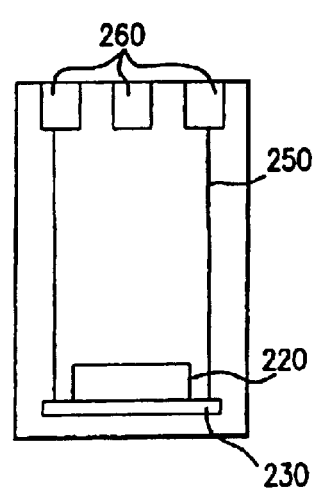

FIGS. 2A–2C respectively illustrate a top, front and side view of another miniature imager. The miniature imager illustrated in FIGS. 2A–C has a very small form factor and can be operated with little or no artificial illumination for very low power operation. The miniature imager includes imager housing 210 which can be made of any number of available metallic or plastic materials which are known to those skilled in the art. Inside of imager housing 210, imager chip 220 is mounted an imager board 230 using any one of the available bonding and mounting techniques. Additionally, the imager chip 220 can be mounted on imager board 230 using chip-on-board technology. The imager chip 220 is arranged in imager housing 210 directly behind lens 240. Lens 240 can be made of any suitable transparent material. The imager chip is enclosed in a dark room 250, which is formed within imager housing 210, to enable the imager chip 220 to operate without an external seal and which simplifies the design of the host device, e.g., camera, terminal or microcomputer.

To achieve contrast in the scene captured by imager chip 220, LEDs 260 can be provided. LEDs 260 can either be discrete or integrated as an array. Further optics for dispersing the light, if necessary, can be placed in the imager housing 210 for illumination of the scene. Alternatively, to achieve contrast in the scene captured by imager chip 220 the size of the aperture can be increased. The increase in the size of the aperture will result in a reduced working range but may reduce power usage by minimizing or eliminating the need to illuminate a target image.

A further alternative to achieve contrast in the scene captured by imager chip 220 can be through the use of a low noise imager with a gain or through the use of a logarithmic response imager. If the noise floor of the imager is below the quantization level of the analog-to-digital converter, then the analog signal can be amplified to increase the contrast of images captured with small amounts of light. A nonlinear transformation, such as a logarithmic one, can be used to enhance contrast between dark parts of the images with little effect on the bright parts. Additionally, any of the above techniques for achieving contrast can be combined to improve the response of the imager. Automatic gain control can be used to achieve a wide intrascene dynamic range.

It should be recognized that the imager illustrated in FIGS. 2A–C can be further modified from that illustrated in the figures. It will be noted that lens 240 is no essential component and may be omitted and/or other optical components may be used together with or instead of lens 240. For example, the optical housing can contain one or more mirrors to direct light on the imager chip to help improve contrast in the scene. Further, the optical housing can contain a prism or other diffractive element to direct light onto the imager chip 220. Additionally, the imager can contain a motor for inserting a clear piece of plastic or glass into the optical path between the lens and the imager, which results in focusing the lens to two different positions. To reduce the cost of the imager housing and lens, these components can be made of molded plastic. Further, a screen used in the mold could form the dark room and lens aperture.

Accordingly, the miniature imager illustrated in FIGS. 2A–2C can be of a small form factor, e.g., SE900 form factor, with maximum dimensions of approximately 20.6× 14.2×11.4 mm$^3$ (0.811×0.559×0.449 inches), resulting in a volume of the imager of 3.3 cm$^3$ (0.20 cubic inches). The SE900 form factor is a form factor which is used in the imager industry for the manufacture of imaging devices. The imager contains optics and electronics sufficient to produce a signal stream, either analog or digital, to a connected microcomputer or display. The imager of the imaging chip 220 can be either CCD or CMOS.

Figure 3:
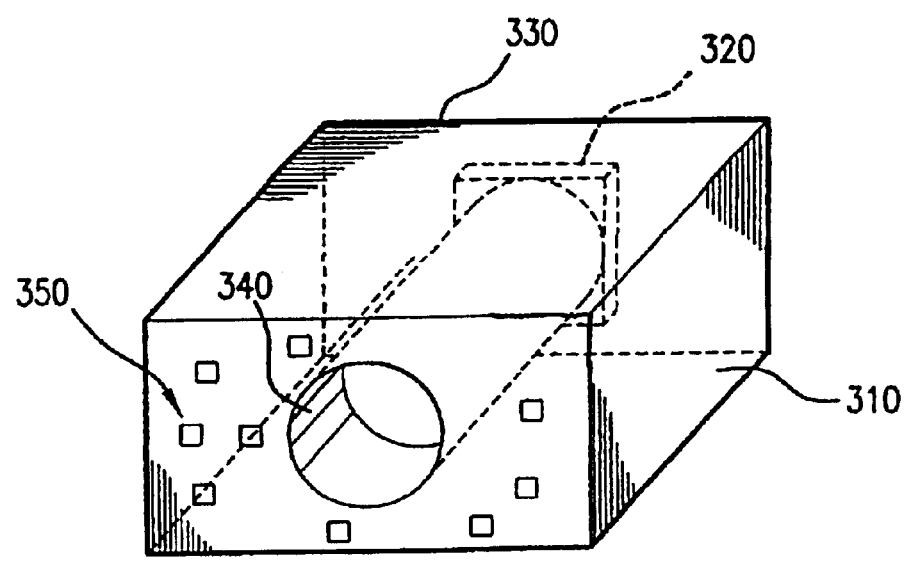
FIG. 3 illustrates a further miniature imager.

FIG. 3 illustrates another miniature imager. The miniature imager illustrated in FIG. 3 includes an imager housing 310. Inside imager housing 310 is an image sensor 320 attached to a printed circuit board 330. The image sensor 320 may be a CMOS image sensor. The printed circuit board is provided near or at the rear of the imager housing 310. An aperture 340 is incorporated into the imager housing 310 so as to allow the image sensor 320 to capture a scene. The front face of the imager housing 310 includes a plurality of LEDs 350 for scene illumination and for aiming. It will be recognized that the layout of the LEDs 350 on the front face of the imager housing can be of any known design that is intended to illuminate a target and to provide assistance to a user aiming a device which incorporates the imager of FIG. 3. The dimensions of the imager of FIG. 3 are approximately 20.6×14.2×11.4 mm$^3$ (width/depth/height), resulting in a volume of the imager of approximately 3.3 cm$^3$ (0.20 cubic inches). Of course, smaller dimensions are possible, for example if a smaller number of pixels or smaller pixel width is used.

Figure 4:
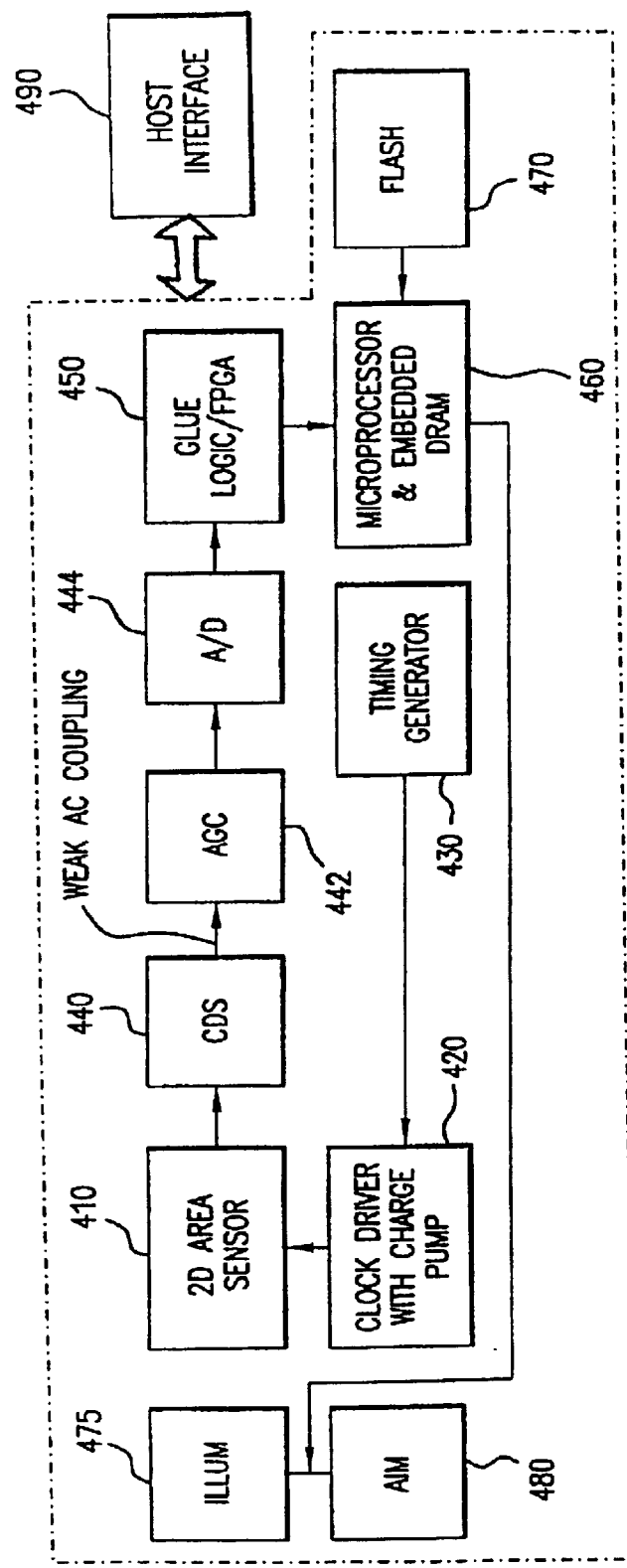
FIG. 4 illustrates the electrical components of a miniature imager.

FIG. 4 illustrates the electronics of a miniature imager. The imager of FIG. 4 includes a 2D area sensor 410 which is controlled via clock driver and charge pump 420. Clock driver and charge pump 420 is controlled in accordance with signals received from timing generator 430. An image captured by 2D area sensor 410 is provided to correlated double sampling block (CDS) 440. Since pixels do not always return to the same value when they are reset, correlated double sampling is used to remove the offset introduced by pixels which have not returned to their normal reset values. Accordingly, correlated double sampling involves capturing two values of the pixels. The first value is the value of the pixels with the desired image, e.g., a bar code, and the second value is the value of the pixels after being reset. The two values of each pixel are compared to remove the offset introduced by pixels which have not returned to their normal reset value. After performing the correlated double sampling, the image is passed through a weak AC coupling to block DC content of the correlated double sampled image. After the weak AC coupling an automatic gain control (AGC) 442 amplifies the signal which is then provided to an analog-to-digital converter 444. In accordance with a preferred embodiment of the present invention, the analog-to-digital converter 444 is a 9 bit analog-to-digital converter.

Digital data is provided by the analog-to-digital converter 444 to the glue logic field programmable gate array (FPGA) block 450. The glue logic/FPGA 450 packs the digital data so that it can be read by microprocessor 460 and connects with the microprocessor 460 to provide all of the camera controls. The microprocessor 460 includes DRAM embedded on the same IC as the microprocessor which increases the speed of the system while allowing a reduced size and cost for the resultant imager. The microprocessor 460 operates under control of a program stored in flash memory 470 via an external data and address bus.

The target image can be illuminated using illumination module 475, which in a preferred embodiment of the present invention is provided by 650 nm red LEDs. The LEDs are arranged so that the target image is uniformly illuminated. To assist a user of the imager, aiming module 480 can be used to provide a unique aiming pattern. Aiming module 480 can include a laser diode and a diffractive optical element (DOE) to provide the unique aiming pattern. Interaction between the host device which incorporates the miniature imager and the miniature imager is provided using host interface 490. Since the imagers described herein are miniature, i.e., of a small form factor, the host device can be a portable radio telephone (cellular phone), a personal digital assistant (PDA), or the like. Using the elements described in connection with FIG. 4 a miniature imager can be achieved which can be manufactured in a SE1223 form factor. The SE1223 form factor is a form factor which is used in the imager industry for the manufacture of imaging devices.

Figure 5:
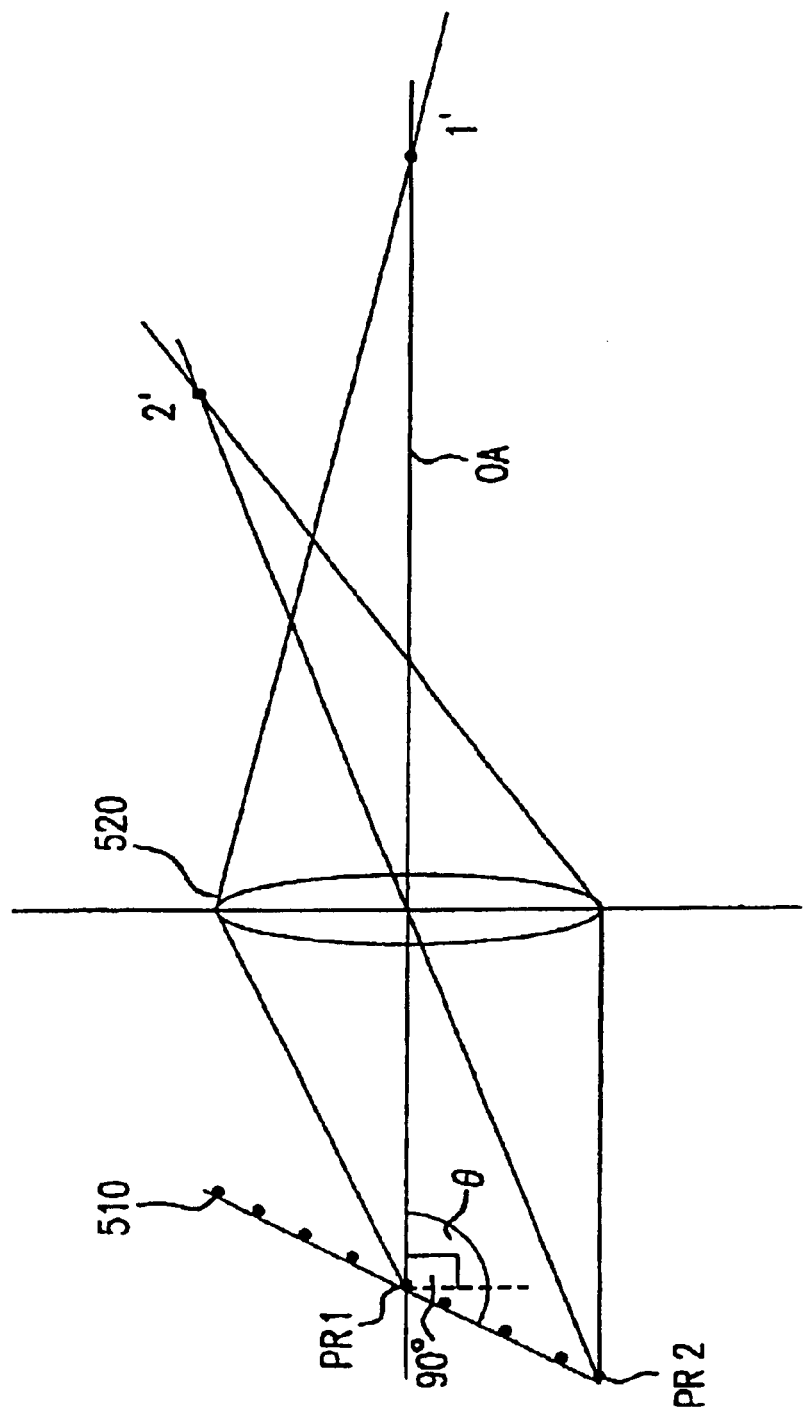
FIG. 5 illustrates an imager with an increased working range.

The working range of an imager may be increased by positioning a plane of the image sensor at an angle which is not perpendicular to the optical axis of the focusing lens. FIG. 5 illustrates an imager with an increased working range. Specifically, the imager includes an image sensor 510 and a focusing lens 520. The image sensor comprises a plurality of horizontal rows of pixels facing the lens 520. Although not illustrated in FIG. 5, it will be recognized that the imager illustrated therein may have additional components similar to those discussed above with respect to FIGS. 1–4.

As illustrated in FIG. 5, a plane parallel to the front of the pixels of imager 510 is tilted at an angle θ with respect to the optical axis of focusing lens 520. Accordingly, for example, one horizontal pixel row PR 1 of the imager 510 is focused at first spatial plane 1' and another horizontal pixel row PR 2 is focused at a second spatial plane 2', different from the first spatial plane 1'. By placing the image sensors of imager 510 at a non-perpendicular angle θ with respect to the optical axis OA of the focusing lens 520, the imager is able to read and decode target images which are at various distances from the imager by interrogating each of the horizontal rows of pixels which are focused at different spatial planes. The ability to read and decode target images which are at various distances reduces user frustration from having to manually adjust the distance between the imager and the target image to successfully read and decode the target image. The imager illustrated in FIG. 5 can be used for reading one-dimensional or two-dimensional bar codes in either a manual or automatic mode.

Figure 6A:
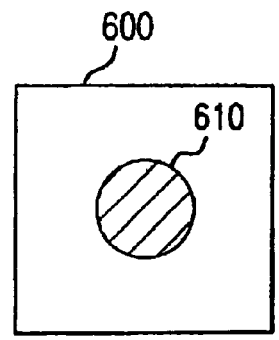
FIG. 6A illustrates a conventional LED.

FIG. 6A illustrates a top view of a conventional LED. The LED 600 includes a bonding pad 610 through which electrical power is supplied to the LED 600. Conventional LEDs, such as the one illustrated in FIG. 6A, have a square shape with dimensions of approximately 350 $\mu$m by 350 $\mu$m. As illustrated in FIG. 6A, the bonding pad 610 is typically placed in the middle of the LED 600. This placement of the bonding pad 610 blocks approximately 30% of the light power emitting from the LED 600. Moreover, as discussed above, conventional LEDs produce less focused light than lasers, the result of which is projected light with an increased line thickness.

Figure 6B:
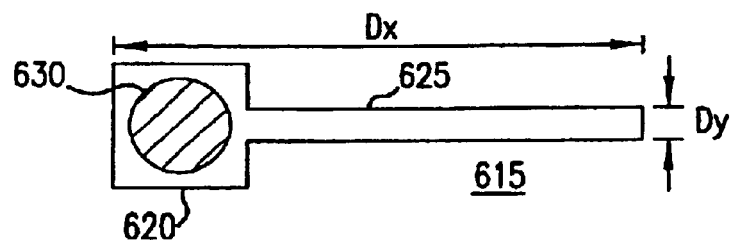
FIG. 6B illustrates an LED which may be used together with the present invention.

FIGS. 6B–6E illustrate three different embodiments of novel LEDs. Generally, the novel LEDs have a die area which is almost the same as the die area of conventional LEDs, thereby maintaining substantially the same emitting power as conventional LEDs. However, the novel LED die is thinned in the focusing direction, i.e., the direction which produces the line thickness, and elongated in another direction. Referring now to FIG. 6B, the LED 615 has a square portion 620 and an elongated rectangular portion 625. More generally and in other words, the novel LED has at least one main portion having a bonding pad and an elongated portion extending from the main portion. It is not necessary that the main portion has a square shape and the elongated portion is rectangular; for example, the corners in the embodiment of FIG. 6B could be rounded. Referring again to FIG. 6B, the square portion 620 has a bonding pad 630. As indicated in the FIG. 6B, the LED 620 has dimensions of $D_x$ by $D_y$, wherein $D_y$ is the width of the elongated portion 625. Since the voltage which drives the LED is supplied via the bonding pad, the amount of light power emitting from the LED decreases the further the portion of the LED is from the bonding pad. Accordingly, in FIG. 6B, the amount of light power emitted from portions of the elongated portion 625 decreases for portions further to the right of the bonding pad 630.

Figure 6C:
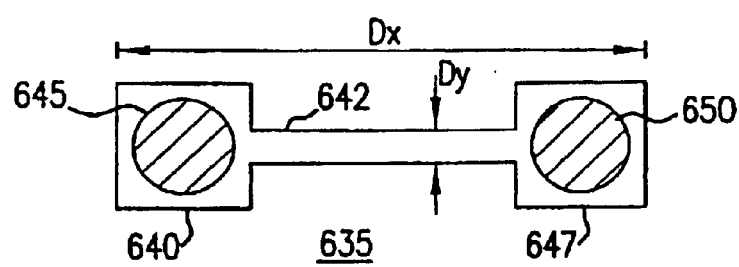
FIG. 6C illustrates another LED which may be used together with the present invention.

FIG. 6C illustrates a top view of another novel LED. Specifically, the LED 635 has two square portions 640 and 647 joined by a rectangular portion 642. Square portion 640 has a bonding pad 645 located thereon and square portion 647 has bonding pad 650 located thereon. By placing bonding pads 645 and 650 on each side of the rectangular portion 642, a more uniform amount of light power emitted from the rectangular portion is achieved compared to the LED 615 illustrated in FIG. 6B.

Figure 6D:
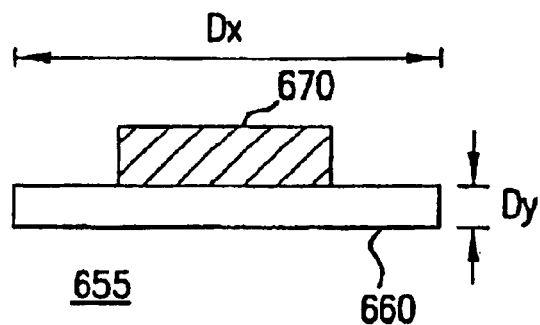
FIG. 6D illustrates yet another LED which may be used together with the present invention.

FIG. 6D illustrates a top view of yet another novel LED. A bonding pad 670 is placed adjacent to the rectangular portion 660 of LED 655.

Accordingly, the bonding pad 670 does not block any light emitted from the elongated portion. Moreover, whereas the placement of the bonding pad in FIG. 6C may result in a reduced amount of light in the center of the rectangular portion, the placement of the bonding pad 670 in FIG. 6D ensures a more uniform distribution of light emitted from the center of the rectangular portion 660 of LED die 655.

Figure 6E:
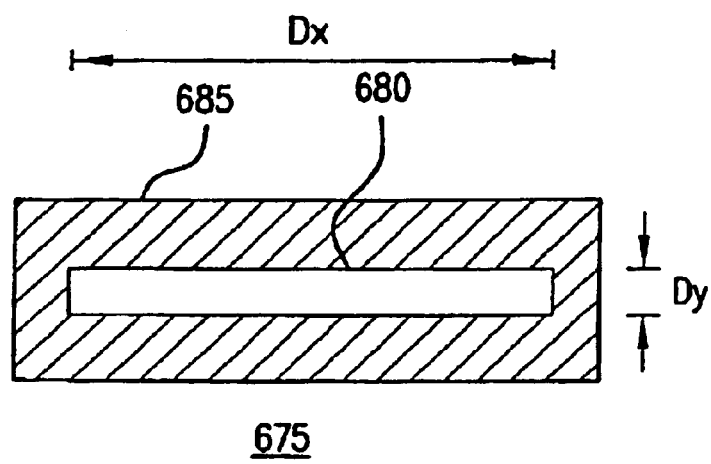
FIG. 6E illustrates yet another LED which may be used together with the present invention.

FIG. 6E illustrates a top view of yet another novel LED. A rectangular portion 680 of the LED die 675 is surrounded on all sides by a bonding pad 685. By surrounding the rectangular portion 680 of the LED die 675 by the bonding pad 685, a uniform distribution of light emitted from the whole rectangular portion 680 of the LED die 675 is achieved compared to the LED dies illustrated in FIGS. 6B–6D. In accordance with one embodiment of the present invention, $D_y$ in FIGS. 6B–6D can be less than or equal to 50 $\mu$m. To maintain the same emitting power as conventional LEDs, $D_x$ in FIGS. 6B–6E is selected such that the die area of the LED is the same as the die area of conventional LEDs.

Figure 7:
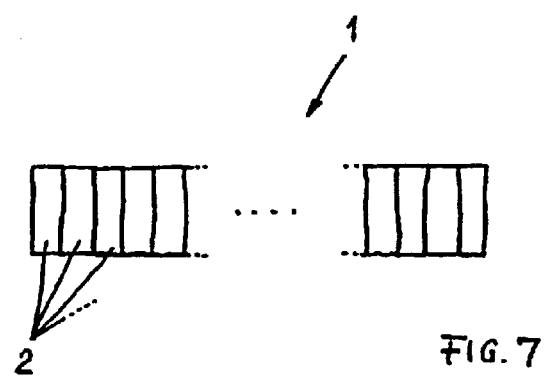
FIG. 7 illustrates a semiconductor device in accordance with the present invention.

FIG. 7 is a highly schematic illustration of a semiconductor device 1 for imaging optical code symbols, in particular bar code symbols, in accordance with the present invention. This semiconductor device may find preferred application as a sensor for imaging a field of view of a bar code reader, and may be used together with some or all of the elements described above, such as in a miniature imager, together with the above described LEDs, and so forth.

The semiconductor device 1 comprises no more than 1024 pixels 2. Preferably, the number of pixels is between 256 and 1024. A preferred embodiment may comprise, for example, 512 pixels. The pixels, 2 each have an aspect ratio that is greater than 2 to 1 with a short dimension not greater than 4 $\mu$m and not less than 2 $\mu$m. While it is generally possible to provide the pixels, e. g., in staggering alternate rows of pixels by one half pixel relative to each other as described above, it is presently preferred to arrange the pixels in a single row as shown in FIG. 7. As is clear from the FIG. 7, the pixels are arranged with the long dimension perpendicular to the row, and with the row being formed with the short dimensions of the pixels being placed adjacent to each other. An aspect ratio of the pixels of more than 2 to 1 will provide superior results for the semiconductor device in reading bar code symbols since the bars and intermediate spaces of the bar code symbols may be well distinguished despite the small size of the semiconductor device.

Such a semiconductor device as described above may form a sensor for imaging a field of view in a bar code reader. Such a sensor is particularly small, but is still capable of reliably imaging a bar code symbol. Since a single semiconductor device of the present invention is sufficient for imaging a bar code symbol, the sensor (and, thus, the bar code reader) may be extraordinarily small which is particularly useful for portable and/or miniature applications of a bar code reader.

The present invention has been described with reference to an exemplary embodiment. However, it will be readily apparent to those skilled in the art that it is possible to embody the invention in specific forms other than that of the exemplary embodiment described above. This may be done without departing from the scope of the invention as defined by the appended claims.

We claim:

1. A bar code reader for reading a symbol having bars spaced apart along a longitudinal direction, each bar extending lengthwise along a transverse direction perpendicular to the longitudinal direction, comprising: a sensor for imaging a field of view of the reader, the sensor comprising a single semiconductor chip having no more than 1024 pixels arranged along a row having a length not exceeding 2 millimeters, each of the pixels having a long dimension, a short dimension, and an aspect ratio that is greater than 2 to 1, the short dimension of each pixel being not greater than 4 $\mu$m and not less than 2 $\mu$m; and a package supporting the chip, the package occupying a volume of no more than 3.3 cubic centimeters.

2. The reader as defined in claim 1, wherein the volume measures approximately 20.6 mm by 14.2 mm by 11.4 mm.

* * * * *